US009219221B2

(12) United States Patent
Funakubo

(10) Patent No.: US 9,219,221 B2
(45) Date of Patent: Dec. 22, 2015

(54) PIEZOELECTRIC ACTUATOR HAVING PRISMATIC PIEZOELECTRIC ELEMENT

(71) Applicant: OLYMPUS CORPORATION, Tokyo (JP)

(72) Inventor: Tomoki Funakubo, Tama (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 13/905,547

(22) Filed: May 30, 2013

(65) Prior Publication Data
US 2013/0257222 A1    Oct. 3, 2013

Related U.S. Application Data

(63) Continuation of application No. PCT/JP2011/077540, filed on Nov. 29, 2011.

(30) Foreign Application Priority Data

Nov. 30, 2010  (JP) ................ 2010-267226

(51) Int. Cl.
*H01L 41/09* (2006.01)
*H01L 41/047* (2006.01)
*H01L 41/257* (2013.01)

(52) U.S. Cl.
CPC ............. *H01L 41/09* (2013.01); *H01L 41/047* (2013.01); *H01L 41/0475* (2013.01); *H01L 41/0966* (2013.01); *H01L 41/257* (2013.01)

(58) Field of Classification Search
USPC ................. 310/328, 323, 367, 368
See application file for complete search history.

(56) References Cited

U.S. PATENT DOCUMENTS

| 3,675,052 | A | * | 7/1972 | Lindsay et al. ............ 310/313 B |
| 5,220,833 | A | * | 6/1993 | Nakamura ................. 73/504.12 |
| 5,883,461 | A | * | 3/1999 | Yamamoto ..................... 310/351 |
| 2004/0151438 | A1 | * | 8/2004 | Ferguson ............... G02B 6/264 385/78 |
| 2008/0013048 | A1 | * | 1/2008 | Gaida et al. .................... 351/205 |
| 2009/0261690 | A1 | * | 10/2009 | Mashimo et al. ......... 310/323.03 |
| 2010/0019621 | A1 | * | 1/2010 | Funakubo et al. ........ 310/323.16 |
| 2010/0149434 | A1 | * | 6/2010 | Desaulniers ......... H04N 9/3129 348/744 |
| 2015/0126858 | A1 | * | 5/2015 | Choi ........................ A61B 1/07 600/425 |

FOREIGN PATENT DOCUMENTS

| JP | S62-119515 A | 5/1987 |
| JP | 02211072 A * | 8/1990 ............... H02N 2/00 |
| JP | H07-321384 A | 12/1995 |
| JP | 2001-041970 A | 2/2001 |
| JP | 2002-022448 A | 1/2002 |
| JP | 2005-150351 A | 6/2005 |

(Continued)

OTHER PUBLICATIONS

International Search Report dated Feb. 21, 2012 issued in PCT/JP2011/077540.
International Preliminary Report on Patentability together with the Written Opinion dated Jun. 13, 2013 received in related International Application No. PCT/JP2011/077540.

(Continued)

*Primary Examiner* — J. San Martin
(74) *Attorney, Agent, or Firm* — Scully, Scott, Murphy & Presser, PC

(57) ABSTRACT

A piezoelectric actuator includes a prismatic piezoelectric element body having side surfaces, and external surface electrodes provided on at least three of the side surfaces of the piezoelectric element body.

16 Claims, 16 Drawing Sheets

(56) References Cited

FOREIGN PATENT DOCUMENTS

| | | |
|---|---|---|
| JP | 2006-238639 A | 9/2006 |
| JP | 2008-38660 A | 2/2008 |
| JP | 2009-212519 A | 9/2009 |

OTHER PUBLICATIONS

Japanese Office Action dated Sep. 15, 2015 from related Japanese Patent Application No. 2012-546887, together with an English language translation.

* cited by examiner

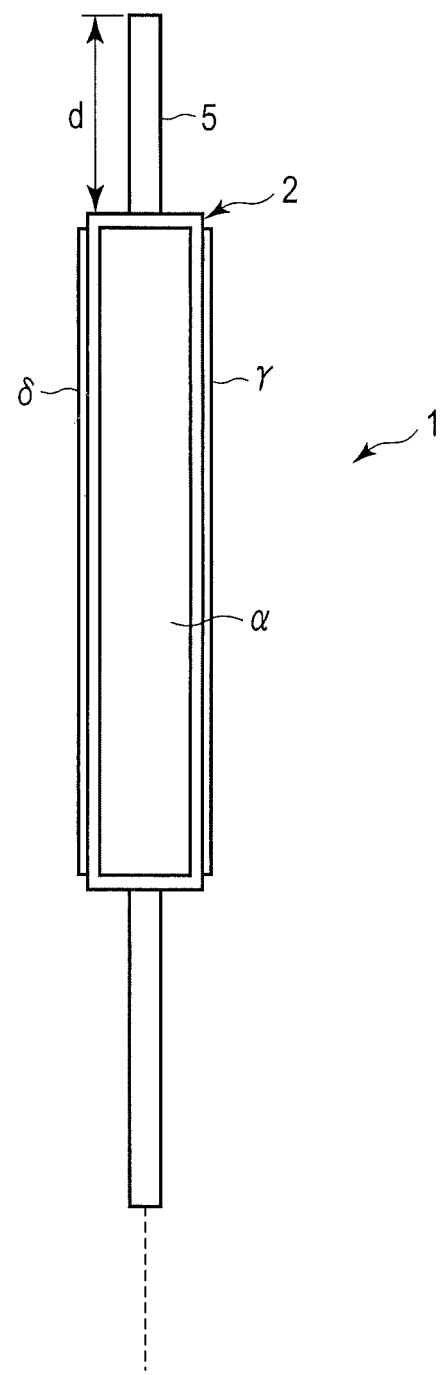
F I G. 1

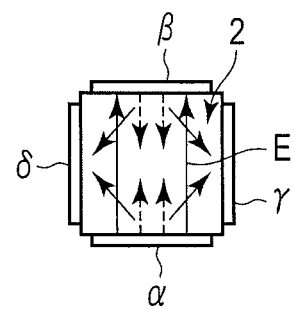
F I G. 5A
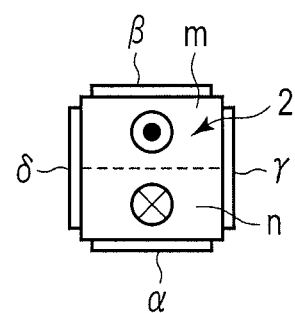
F I G. 5B

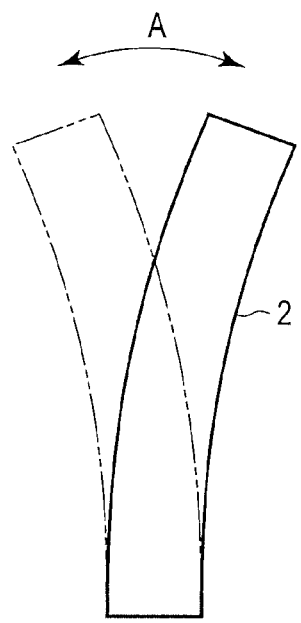
F I G. 6A
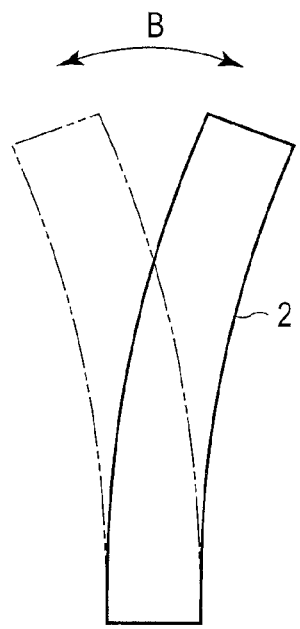
F I G. 6B

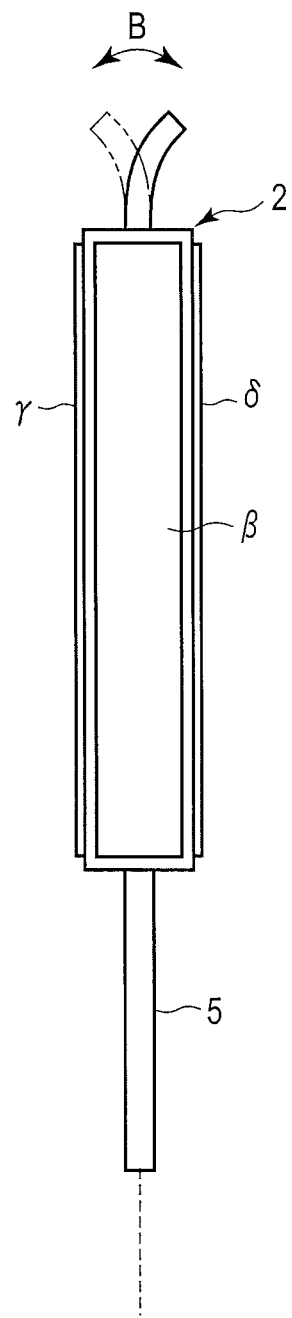
F I G. 7B

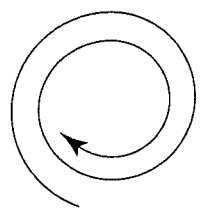
F I G. 7C
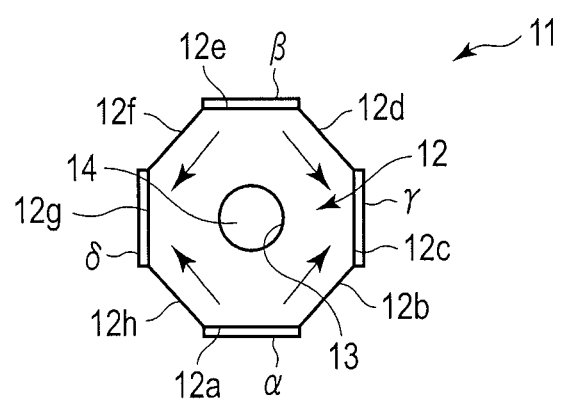
F I G. 8A

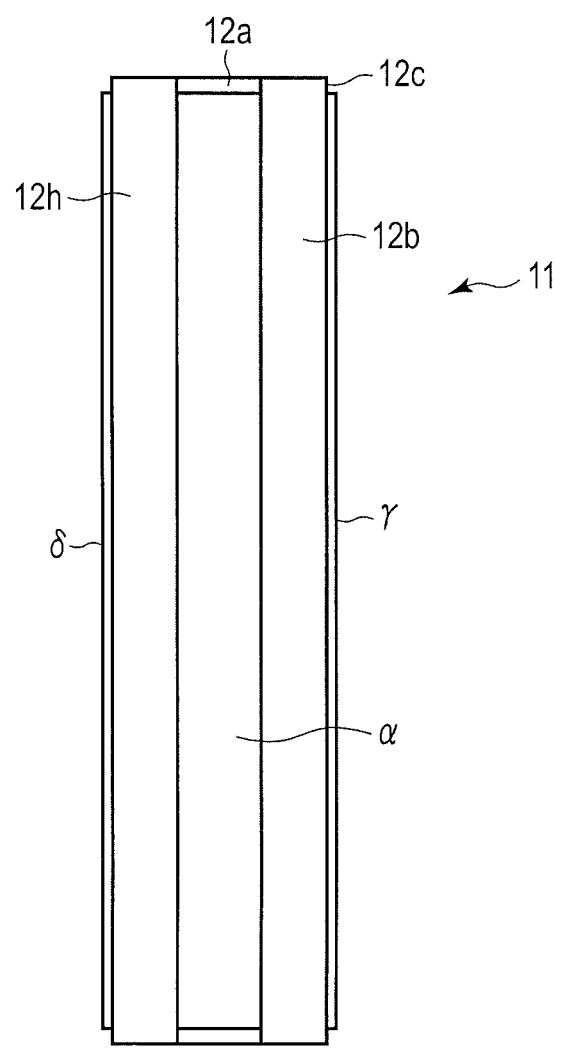
F I G. 8B

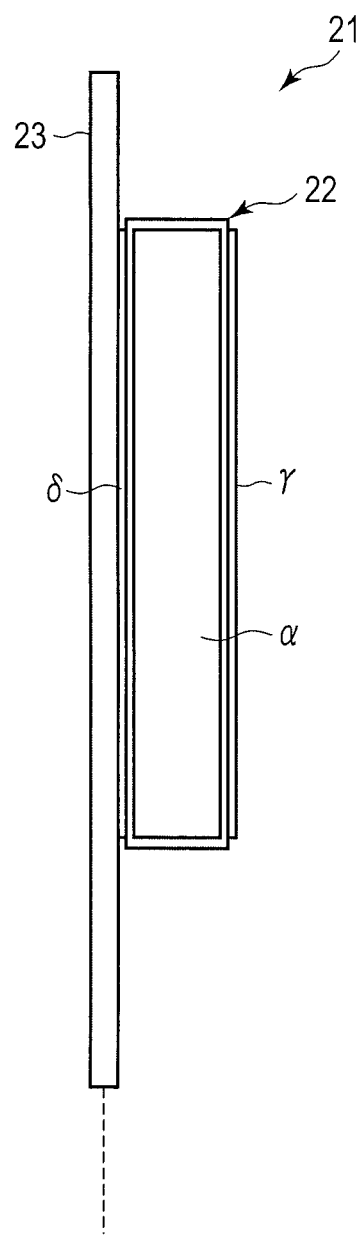
F I G. 9A

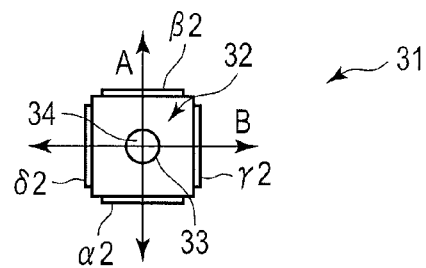
F I G. 11A
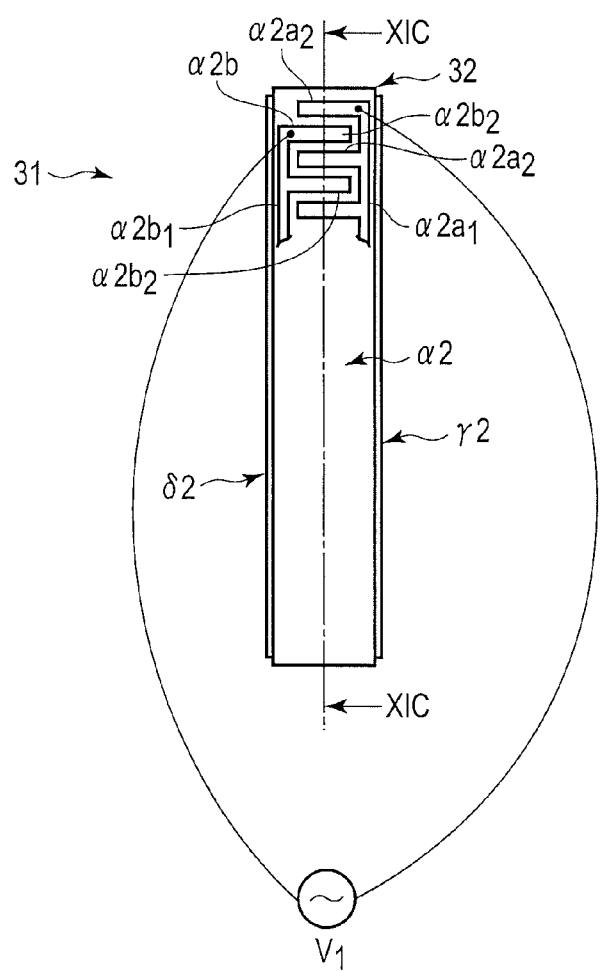
F I G. 11B

PIEZOELECTRIC ACTUATOR HAVING PRISMATIC PIEZOELECTRIC ELEMENT

CROSS REFERENCE TO RELATED APPLICATIONS

This application is a Continuation Application of PCT Application No. PCT/JP2011/077540, filed Nov. 29, 2011 and based upon and claiming the benefit of priority from prior Japanese Patent Application No. 2010-267226, filed Nov. 30, 2010, the entire contents of all of which are incorporated herein by reference.

BACKGROUND OF THE INVENTION

1. Field of the Invention

The present invention relates to a piezoelectric actuator in which a piezoelectric element is used.

2. Description of the Related Art

In a small-diameter observation device such as an endoscope, a piezoelectric actuator using a piezoelectric element is used sometimes as an actuator which bends and vibrates an optical fiber when light scanning is performed by using a light transmitting fiber. As the actuator which bends and vibrates the optical fiber, there is an actuator disclosed in Jpn. Pat. Appln. KOKAI Publication No. 2009-212519.

In this piezoelectric actuator, on an outer peripheral surface of a cylindrical piezoelectric element, an external surface electrode is divided into four electrodes in a peripheral direction so that the electrodes extend in a longitudinal direction (a central axis direction of the cylinder), respectively. In consequence, the four polarized external surface electrodes are formed. Furthermore, an inner peripheral surface of a through hole provided in the center of the cylindrical piezoelectric element is provided with an internal surface electrode which becomes a GND.

At the polarization of the piezoelectric actuator, a direct-current voltage is applied between the external surface electrode and the GND to form the polarization. At an operation of the piezoelectric actuator, an alternating voltage is applied between a pair of external surface electrodes in an X-direction and the GND, whereby one piezoelectric element becomes an elongating region, and the other piezoelectric element becomes a contracting region to generate reverse strain. In consequence, the piezoelectric elements perform a bending resonant vibration in the X-direction. Similarly, the alternating voltage is applied between a pair of external surface electrodes in a Y-direction and the GND, whereby the piezoelectric elements perform the bending resonant vibration in the Y-direction. As a result, the optical fiber can be bent and vibrated in the X-direction and the Y-direction, and the light scanning can be performed in the X-direction and the Y-direction.

In a piezoelectric actuator disclosed in Jpn. Pat. Appln. KOKAI Publication No. 2009-212519, a small-diameter cylindrical body is used in which an outer diameter of a cylindrical piezoelectric element is, for example, about 1 mm or less. However, it is difficult that an external surface electrode is divided into four electrodes in a peripheral direction on an outer peripheral surface of the small-diameter cylindrical body to form the four electrodes thereon, and this operation is noticeably laborious. Moreover, an inner diameter of the cylindrical piezoelectric element is, for example, about 50 μm to 500 μm. Therefore, when an internal surface electrode is provided on an inner peripheral surface of a through hole of the cylindrical piezoelectric element, it is difficult to allow a plating liquid to flow into a cylinder of the small-diameter cylindrical body, which makes it difficult to form the internal surface electrode in the cylinder of the small-diameter cylindrical body by plating, and this operation is similarly noticeably laborious.

BRIEF SUMMARY OF THE INVENTION

The present invention has been developed in view of the above situation, and an object thereof is to provide a piezoelectric actuator in which it is possible to comparatively easily provide external surface electrodes of a piezoelectric element, and an internal surface electrode is not required.

An aspect of the present invention is a piezoelectric actuator, the piezoelectric actuator including a prismatic piezoelectric element body having side surfaces, and external surface electrodes provided on at least three of the side surfaces of the piezoelectric element body.

Another aspect of the present invention is a driving method of the piezoelectric actuator, the method including applying a direct-current voltage between one pair constituting two of the external surface electrodes to polarize the piezoelectric element body, and applying an alternating voltage between another pair constituting two of the external surface electrodes to curve and vibrate the piezoelectric element body.

Still another aspect of the present invention is a piezoelectric actuator, the piezoelectric actuator including a prismatic piezoelectric element body having side surfaces, and an interdigital electrode provided on at least one of the side surfaces of the piezoelectric element body, and constituted of two comb teeth-like electrodes.

Yet still another aspect of the present invention is a driving method of the piezoelectric actuator, the method including applying a direct-current voltage between the comb teeth-like electrodes of the interdigital electrode to polarize the piezoelectric element body, and applying an alternating voltage between the comb teeth-like electrodes of the interdigital electrode to curve and vibrate the piezoelectric element body.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a side view showing the whole schematic constitution of a piezoelectric actuator of a first embodiment;

FIG. 5A is an explanatory view to explain a relationship between an electric field (an electric force line) E and a polarization component which act on the piezoelectric element body when an alternating voltage $V_1$ is applied between external surface electrodes α and β of the piezoelectric actuator of the first embodiment;

FIG. 5B is an explanatory view to explain an elongating region m and a contracting region n of the piezoelectric element body of the piezoelectric actuator of the first embodiment;

FIG. 6A is an explanatory view to explain a first bending vibration of the piezoelectric element body of the piezoelectric actuator of the first embodiment;

FIG. 6B is an explanatory view to explain the first bending vibration of the piezoelectric element body of the piezoelectric actuator of the first embodiment;

FIG. 7B is a side view showing the operation state of the optical fiber by the piezoelectric actuator of the first embodiment, and showing a resonant vibration in a B-direction in the primary resonance mode of the piezoelectric element body including the one fixed end;

FIG. 7C is a characteristic diagram showing a spiral orbit of the optical fiber by the piezoelectric actuator of the first embodiment;

FIG. 8A is a plan view of a piezoelectric element body of a piezoelectric actuator of a second embodiment;

FIG. 8B is a side view of the piezoelectric element body of the piezoelectric actuator of the second embodiment;

FIG. 9A is a side view showing the whole schematic constitution of a piezoelectric actuator of a third embodiment;

FIG. 11A is a plan view of the piezoelectric element body to explain a first bending vibration and a second bending vibration of the piezoelectric element body of the piezoelectric actuator of the fourth embodiment;

FIG. 11B is a side view of the piezoelectric element body of the piezoelectric actuator of the fourth embodiment;

DETAILED DESCRIPTION OF THE INVENTION

First Embodiment (Constitution)

FIGS. 1, 2A, 2B, 3, 4, 5A, 5B, 6A, 6B, 7A, 7B and 7C show a first embodiment. FIG. 1 is a side view showing the whole schematic constitution of a piezoelectric actuator 1 of the present embodiment suitable for performing light scanning in which a light transmitting fiber having flexibility and photoconductive characteristics is used, in a small-diameter observation device such as an endoscope.

Figure 2A:
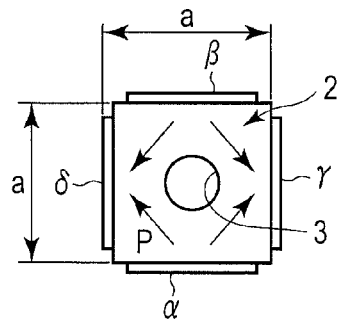
FIG. 2A is a plan view of a piezoelectric element body of the piezoelectric actuator of the first embodiment.
Figure 2B:
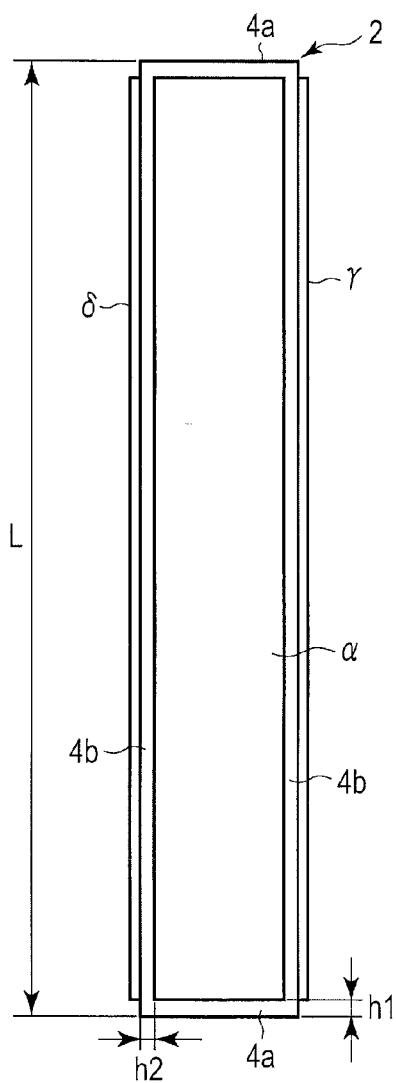
FIG. 2B is a side view of the piezoelectric element body of the piezoelectric actuator of the first embodiment.

The piezoelectric actuator 1 of the present embodiment has a prismatic piezoelectric element body 2. A base material of the piezoelectric element body 2 is a lead zirconate titanate (subsequently referred to as PZT) ceramic material. As shown in FIG. 2B, a length of the piezoelectric element body 2 of the present embodiment is L. As shown in FIG. 2A, a cross-sectional shape of the piezoelectric element body 2 is a square having a longitudinal length a and a lateral length a, and the center (the axial center) of the piezoelectric element body 2 is provided with a through hole 3 extending in a longitudinal direction of the piezoelectric element body 2.

Four side surfaces of the piezoelectric element body 2 are provided with external surface electrodes α, β, γ and δ of silver electrodes, respectively. Here, on one of the side surfaces of the piezoelectric element body 2, the external surface electrode α is provided, and on the opposite side surface, the external surface electrode β is disposed, and on one of the remaining side surfaces, the external surface electrode γ is disposed, and on the opposite side surface, the external surface electrode δ is disposed.

The silver electrodes of the external surface electrodes α, β, γ and δ are provided by a conventional printing process with masks. At each of an upper end portion and a lower end portion of each side surface of the piezoelectric element body 2, an insulating portion 4a having a short length h1 is provided for prevention of creeping discharge. Similarly, on each of both side portions of each side surface of the piezoelectric element body 2, an insulating portion 4b having a short length h2 is provided for the prevention of the creeping discharge. It is to be noted that h1 may be equal to h2, or h1 may be different from h2.

An optical fiber 5 is mounted within the through hole 3. The optical fiber 5 is bonded to the piezoelectric element body 2 with adhesive so that in FIG. 1, an upper end portion of the optical fiber is cantilevered with a suitable length d from an upper end surface of the piezoelectric element body 2. It is to be noted that any electrodes are not provided in the through hole 3 of the piezoelectric element body 2.

Figure 3:
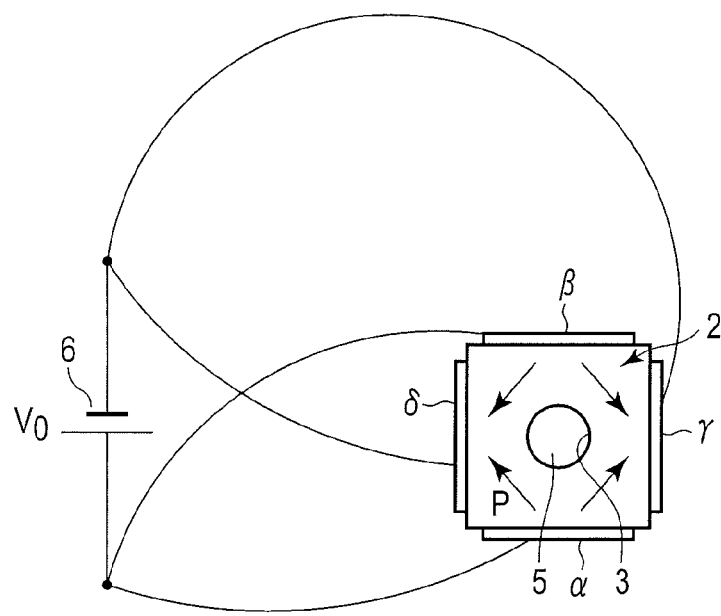
FIG. 3 is a schematic constitutional view showing an electric circuit of the piezoelectric actuator of the first embodiment.

Next, polarization of the piezoelectric actuator 1 will be described with reference to FIG. 3. In FIG. 3, a positive electrode of a direct-current power source 6 is connected to the external surface electrodes α and β, and a negative electrode of the direct-current power source 6 is connected to the external surface electrodes γ and δ. A high direct-current voltage $V_0$ of the positive electrode is applied to the external surface electrodes α and β, and the high direct-current voltage of the negative electrode is applied to the external surface electrodes γ and δ. As a result, as shown by arrows P in FIG. 3, the polarization of vectors from the external surface electrode α toward the adjacent external surface electrodes γ and δ takes place. Similarly, the polarization of vectors from the external surface electrode β toward the adjacent external surface electrodes γ and δ takes place.

(Operation)

Figure 4:
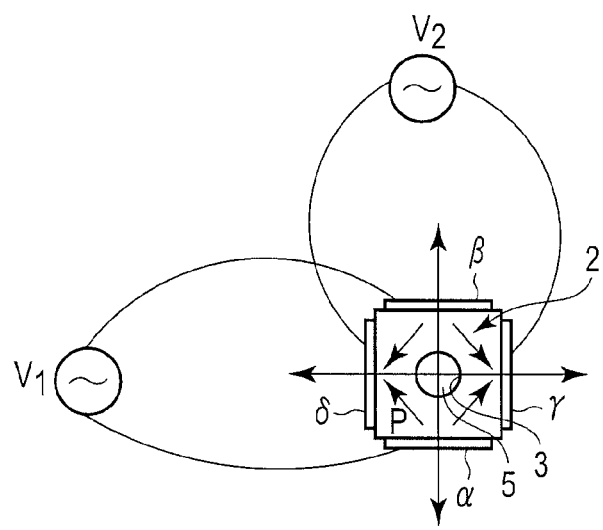
FIG. 4 is a schematic constitutional view for explaining an operation state of the piezoelectric actuator of the first embodiment.

Next, an operation of the above constitution will be described. When the piezoelectric actuator 1 of the present embodiment is driven, as shown in FIG. 4, an alternating voltage $V_1$ is applied between the external surface electrodes α and β, and/or an alternating voltage $V_2$ is applied between γ and δ.

There will be described, for example, a case where the alternating voltage $V_1$ is applied between the external surface electrodes α and β of the piezoelectric element body 2. In this case, as shown in FIG. 5A, on electric fields (electric force lines) E which act between the external surface electrodes α and β of the piezoelectric element body 2, polarization components (shown by broken-line arrows) parallel to the electric fields start to act, and as shown in FIG. 5B, a half of the piezoelectric element body 2 including a length direction (the L-direction) becomes an elongating region m, and the other half becomes a contracting region n. It is to be noted that for easily understanding the explanation, the center through hole 3 is omitted from FIGS. 5A and 5B. At this time, strain is generated in the piezoelectric element body 2, and the piezoelectric element body 2 is deformed so that an upper portion of the body having a lower end portion as a fixed end is curved to the left side of the center line as shown by, for example, an imaginary line in FIG. 6A. It is to be noted that FIG. 6A shows a displaced state of the piezoelectric element body 2 seen from the external surface electrode γ side in FIG. 5A.

Here, since the voltage to be applied between the external surface electrodes α and β is the alternating voltage, totally reverse strain is generated in the piezoelectric element body 2 in a remaining half period, whereby the body bends in an opposite direction. In consequence, the piezoelectric element body is deformed so that the upper portion of the body having the lower end portion as the fixed end is curved to the right side of the center line as shown by, for example, a solid line in FIG. 6A.

In consequence, as shown in FIG. 6A, the upper portion of the piezoelectric element body 2 having the lower end portion as the fixed end bends and vibrates in the right-left direction as shown by an arrow A of FIG. 6A (a first bending vibration of the piezoelectric element body 2).

This also applies to a case where the alternating voltage $V_2$ is applied between the external surface electrodes γ and δ. FIG. 6B shows a displaced state of the piezoelectric element body 2 seen from the external surface electrode β side in FIG. 5A. In consequence, as shown in FIG. 6B, the upper portion of the body having the lower end portion as the fixed end bends and vibrates in the right-left direction as shown by an arrow B of FIG. 6B (a second bending vibration of the piezoelectric element body 2).

Next, an operation of the optical fiber 5 will be described with reference to FIGS. 7A, 7B, and 7C. When the piezoelectric actuator 1 performs the above-mentioned operation (the first bending vibration and the second bending vibration of the piezoelectric element body 2) shown in FIGS. 6A and 6B, the optical fiber 5 performs a bending resonant vibration in the A-direction shown in FIG. 7A, or a bending resonant vibration in the B-direction shown in FIG. 7B.

The alternating voltage having a frequency in the vicinity of a resonance frequency of the optical fiber 5 is applied to the piezoelectric actuator 1. These vibrations are two resonant vibrations of the optical fiber 5 whose upper end portion has one fixed end and is cantilevered with the length d from the upper end surface of the piezoelectric element body 2 as shown in FIG. 1.

Figure 7A:
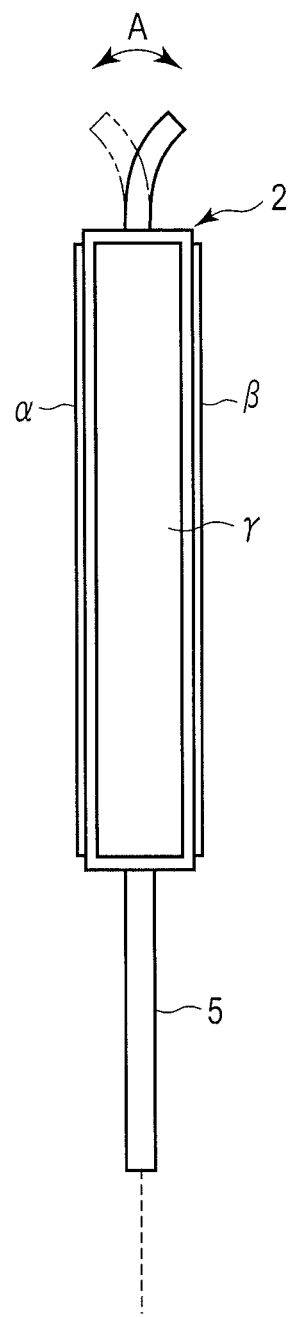
FIG. 7A is a side view showing an operation state of an optical fiber by the piezoelectric actuator of the first embodiment, and showing a resonant vibration in an A-direction in a primary resonance mode of the piezoelectric element body including one fixed end.

It is to be noted that FIGS. 7A and 7B show the case of a primary resonance mode in a state where the one end of the upper end portion of the optical fiber 5 is fixed to the upper end surface of the piezoelectric element body 2, but the mode may be a secondary resonance mode or a higher order mode in the state where the one end is fixed. Furthermore, in the present embodiment, a non-resonant simple bending operation of the piezoelectric actuator 1 itself has been described, but a resonance mode such as a primary bending resonance mode may be utilized.

Phases of the two vibrations of the optical fiber 5 are shifted as much as 90°, and an amplitude is changed little by little, whereby it is possible to obtain a spiral orbit shown in FIG. 7C. In consequence, a scanning pattern of the spiral orbit can be controlled as the scanning pattern of the optical fiber 5. Furthermore, the scanning pattern is not limited to the spiral orbit, and can be controlled to obtain various rotation loci.

(Effect)

In consequence, the above constitution produces the following effects. That is, in the piezoelectric actuator 1 of the present embodiment, the shape of the piezoelectric element body 2 is the prismatic shape, and hence the external surface electrodes α, β, γ and δ can easily be formed on four side surfaces of the piezoelectric element body 2 by a conventional printing technology. Moreover, when the piezoelectric element body is polarized by using the external surface electrodes α, β, γ and δ on the four side surfaces of the piezoelectric element body 2, the direct-current voltage is applied between the adjacent external surface electrodes to polarize the body, whereby it is not necessary to dispose an internal surface electrode in the through hole 3 of the piezoelectric element body 2. As a result, it is possible to provide the piezoelectric actuator 1 which can simplify the whole constitution of the piezoelectric element body 2, and can facilitate manufacturing thereof.

It is to be noted that in the piezoelectric actuator 1 of the above embodiment, the example of the scanning pattern of the spiral orbit has been described as the scanning pattern of the optical fiber 5, but the present invention is not limited to this example. By changing a sequence of control signals or signal intensities, part or all of a scanning region can repeatedly be scanned, or a scanning speed can be increased or decreased.

Moreover, in the present embodiment, the non-resonant simple bending operation of the piezoelectric actuator 1 itself has been described, but a resonance mode such as the primary bending resonance mode may be utilized.

Second Embodiment (Constitution)

FIGS. 8A and 8B show a second embodiment. The present embodiment is a modification in which a piezoelectric actuator 11 is provided by changing the constitution of the piezoelectric actuator 1 of the first embodiment (see FIGS. 1, 2A, 2B, 3, 4, 5A, 5B, 6A, 6B, 7A, 7B and 7C) as follows.

The piezoelectric actuator 11 of the present embodiment has an octagonal prismatic piezoelectric element body 12 as shown in FIG. 8A. The center (the axial center) of the piezoelectric element body 12 is provided with a through hole 13 extending in a longitudinal direction of the piezoelectric element body 12. An optical fiber 14 is mounted within the through hole 13.

On eight side surfaces 12a to 12h of the piezoelectric element body 12, external surface electrodes α, β, γ and δ are provided every other surface. Connecting states of the four external surface electrodes α, β, γ and δ to a direct current power source 6 (see FIG. 3) are the same as in the first embodiment.

(Effect)

Also in the piezoelectric actuator 11 of the present embodiment of the above constitution, the shape of the piezoelectric element body 12 is the octagonal prismatic shape, and hence the external surface electrodes α, β, γ and δ can easily be formed every other surface on the eight side surfaces 12a to 12h of the piezoelectric element body 12 by a conventional printing technology. Moreover, when the piezoelectric element body is polarized by using the external surface electrodes α, β, γ and δ of the piezoelectric element body 12, a direct-current voltage is applied between the external surface electrodes every other surface to polarize the body, whereby it is not necessary to provide an internal surface electrode in the through hole 13 of the piezoelectric element body 12. As a result, it is possible to provide the piezoelectric actuator 11 which can simplify the whole constitution of the piezoelectric element body 12, and can facilitate manufacturing thereof.

Third Embodiment (Constitution)

Figure 9B:
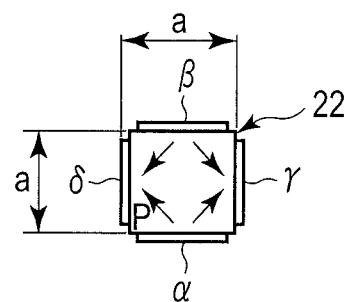
FIG. 9B is a plan view of a piezoelectric element body of the piezoelectric actuator of the third embodiment.
Figure 9C:
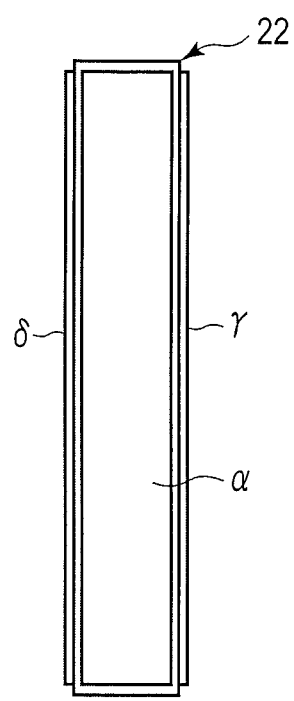
FIG. 9C is a side view of the piezoelectric element body of the piezoelectric actuator of the third embodiment.

FIGS. 9A, 9B and 9C show a third embodiment. The present embodiment is a modification in which a piezoelectric actuator 21 is provided by changing the constitution of the piezoelectric actuator 1 of the first embodiment (see FIGS. 1, 2A, 2B, 3, 4, 5A, 5B, 6A, 6B, 7A, 7B and 7C) as follows.

In the piezoelectric actuator 21 of the present embodiment, any through holes are not made in a piezoelectric element body 22, and an optical fiber 23 is bonded to a side surface of the piezoelectric element body 22. On four side surfaces of the piezoelectric element body 22, external surface electrodes $\alpha$, $\beta$, $\gamma$ and $\delta$ are formed in the same manner as in the first embodiment. Connecting states of the four external surface electrodes $\alpha$, $\beta$, $\gamma$ and $\delta$ to a direct current power source 6 (see FIG. 3) are the same as in the first embodiment.

(Effect)

Also in the piezoelectric actuator 21 of the present embodiment of the above constitution, the shape of the piezoelectric element body 22 is a quadrangular prismatic shape, and hence the external surface electrodes $\alpha$, $\beta$, $\gamma$ and $\delta$ can easily be formed on the four side surfaces of the piezoelectric element body 22 by a conventional printing technology. Moreover, when the piezoelectric element body is polarized by using the external surface electrodes $\alpha$, $\beta$, $\gamma$ and $\delta$ of the piezoelectric element body 22, a direct-current voltage is applied between the adjacent external surface electrodes to polarize the body, whereby it is not necessary to provide an internal surface electrode in the piezoelectric element body 22. As a result, it is possible to provide the piezoelectric actuator 21 which can simplify the whole constitution of the piezoelectric element body 22, and can facilitate manufacturing thereof in the same manner as in the first embodiment.

Fourth Embodiment (Constitution)

FIGS. 10A, 10B and 10C and FIGS. 11A, 11B and 11C show a fourth embodiment. The present embodiment is a modification in which a piezoelectric actuator 31 is provided by changing the constitution of the piezoelectric actuator 1 of the first embodiment (see FIGS. 1, 2A, 2B, 3, 4, 5A, 5B, 6A, 6B, 7A, 7B and 7C) as follows.

That is, the piezoelectric actuator 31 of the present embodiment has a prismatic piezoelectric element body 32 made of a PZT material in the same manner as in the first embodiment. On four side surfaces of this piezoelectric element body 32, interdigital electrodes $\alpha 2$, $\beta 2$, $\gamma 2$ and $\delta 2$ are provided, respectively. These interdigital electrodes $\alpha 2$, $\beta 2$, $\gamma 2$ and $\delta 2$ are constituted of comb teeth-like interdigital right electrodes $\alpha 2a$, $\beta 2a$, $\gamma 2a$ and $\delta 2a$, and comb teeth-like interdigital left electrodes $\alpha 2b$, $\beta 2b$, $\gamma 2b$ and $\delta 2b$, respectively (FIG. 10B only shows the interdigital right electrode $\alpha 2a$ and the interdigital left electrode $\alpha 2b$ of the interdigital electrode $\alpha 2$). Here, the interdigital right electrode $\alpha 2a$ has, on the one side surface of the piezoelectric element body 32, one vertical electrode portion $\alpha 2a_1$ extending in a central axis direction of the piezoelectric element body 32, and lateral electrode portions $\alpha 2a_2$ extending in a left direction orthogonal to this vertical electrode portion $\alpha 2a_1$, and the whole interdigital right electrode is formed into a comb teeth-like shape toward the left. Similarly, the interdigital left electrode $\alpha 2b$ has, on the one side surface of the piezoelectric element body 32, one vertical electrode portion $\alpha 2b_1$ extending in the central axis direction of the piezoelectric element body 32, and lateral electrode portions $\alpha 2b_2$ extending in a right direction orthogonal to this vertical electrode portion $\alpha 2b_1$, and the whole interdigital left electrode is formed into a comb teeth-like shape toward the right. The respective lateral electrode portions $\alpha 2a_2$ of the interdigital right electrode $\alpha 2a$ and the respective lateral electrode portions $\alpha 2b_2$ of the interdigital left electrode $\alpha 2b$ are alternately arranged side by side via spaces, respectively. It is to be noted that the other interdigital electrodes $\beta 2$, $\gamma 2$ and $\delta 2$ also have constitutions similar to the interdigital electrode $\alpha 2$. In consequence, the interdigital electrodes $\alpha 2$, $\beta 2$, $\gamma 2$ and $\delta 2$ on the four side surfaces of the piezoelectric element body 32 are formed into the same electrode shape.

Figure 10A:
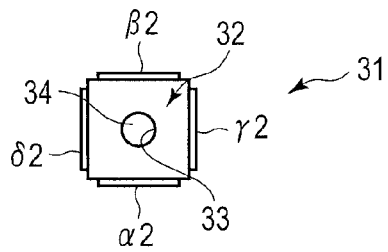
FIG. 10A is a plan view of a piezoelectric element body of a piezoelectric actuator of a fourth embodiment.
Figure 10B:
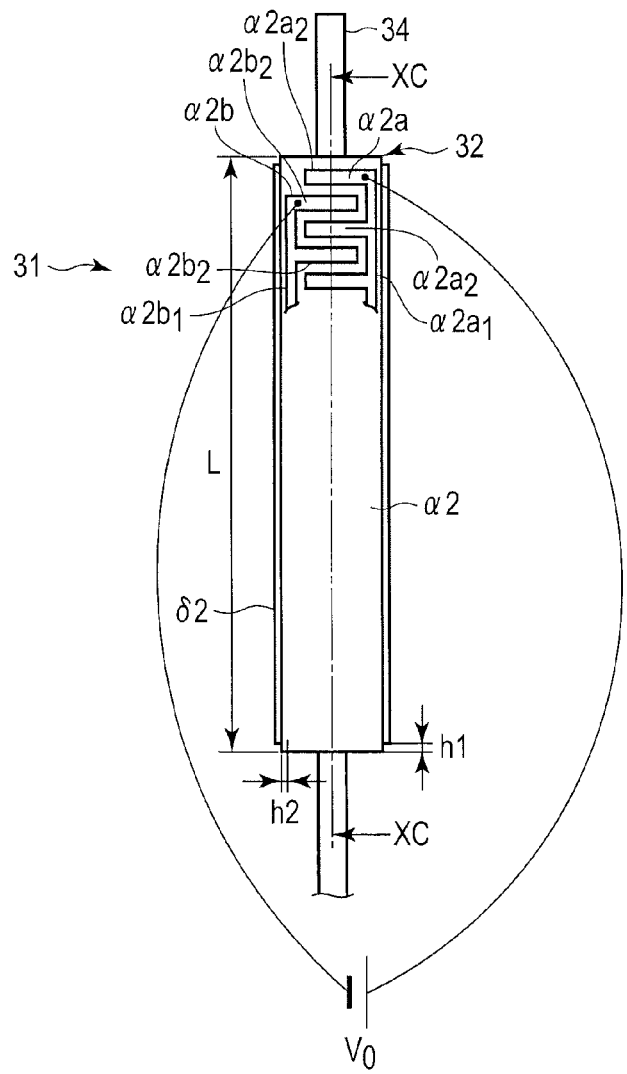
FIG. 10B is a side view of the piezoelectric element body of the piezoelectric actuator of the fourth embodiment.
Figure 10C:
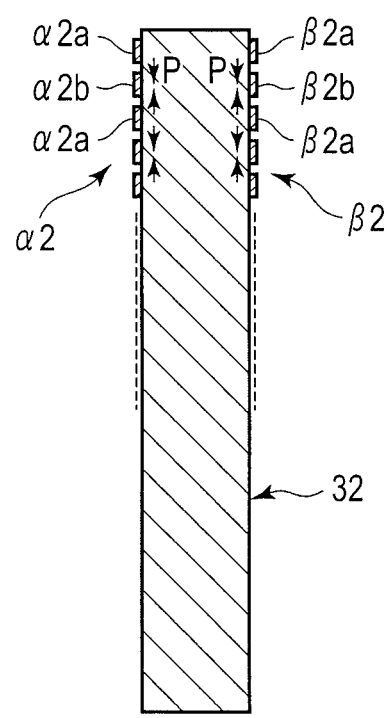
FIG. 10C is a cross-sectional view taken along the XC-XC line of FIG. 10B of the piezoelectric element body of the piezoelectric actuator of the fourth embodiment.

Moreover, to provide polarization in the vicinity of the surface of the piezoelectric element body 32 of PZT as shown in FIG. 10B, a high direct-current voltage $V_0$ is applied between the interdigital right electrode $\alpha 2a$ and the interdigital left electrode $\alpha 2b$. Then, between each lateral electrode portion $\alpha 2a_2$ of the interdigital right electrode $\alpha 2a$ and each lateral electrode portion $\alpha 2b_2$ of the interdigital left electrode $\alpha 2b$ in the vicinity of the surface of the piezoelectric element body 32, the polarization takes place as shown by arrows P in FIG. 10C. It is to be noted that FIG. 10C is a cross-sectional view taken along the XC-XC line of FIG. 10B.

Furthermore, in the center (the axial center) of the piezoelectric element body 32, a through hole 33 extending in a longitudinal direction of the piezoelectric element body 32 is provided as shown in FIG. 10A. An optical fiber 34 is bonded to the inside of this through hole 33 with adhesive.

(Operation)

Next, an operation of the piezoelectric actuator 31 of the present embodiment of the above constitution will be described with reference to FIGS. 11A, 11B, and 11C. For example, to cause a first bending vibration shown by an arrow A in an upward-downward direction of FIG. 11A, the interdigital electrodes $\alpha 2$ and $\beta 2$ are used. An alternating voltage $V_1$ is applied to the interdigital electrode $\alpha 2$, and simultaneously, an alternating voltage $V_2$ is applied to the interdigital electrode $\beta 2$. At this time, a phase difference in alternating voltage between the interdigital electrode $\alpha 2$ and the interdigital electrode $\beta 2$ is 180 degrees.

Figure 11C:
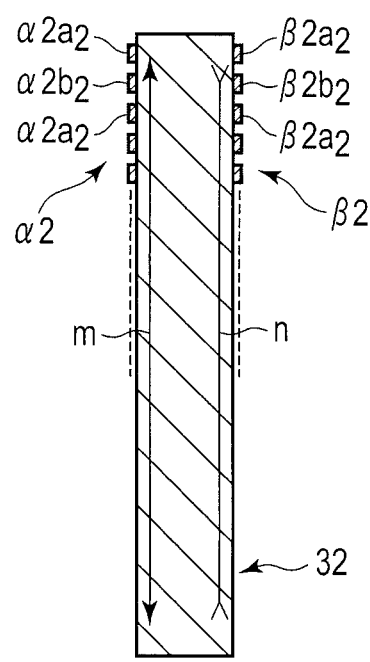
FIG. 11C is a cross-sectional view taken along the XIC-XIC line of FIG. 11B of the piezoelectric element body of the piezoelectric actuator of the fourth embodiment.

Here, for example, when the alternating voltage $V_1$ is applied to the interdigital electrode $\alpha 2$ as shown in FIG. 11B, a region m in the vicinity of the interdigital electrode $\alpha 2$ can be elongated at a certain moment as shown in FIG. 11C, and simultaneously, when the alternating voltage $V_2$ is applied to the interdigital electrode $\beta 2$, a region n in the vicinity of the interdigital electrode $\beta 2$ can be contracted. It is to be noted that FIG. 11C is a cross-sectional view taken along the XIC-XIC line of FIG. 11B.

In consequence, the phase difference in alternating voltage between the interdigital electrode $\alpha 2$ and the interdigital electrode $\beta 2$ is 180 degrees, whereby a bending vibration in an arrow A direction shown in FIG. 6A can be caused. Similarly, a phase difference in alternating voltage between the interdigital electrodes $\gamma 2$ and $\delta 2$ is 180 degrees, whereby a bending vibration in an arrow B direction shown in FIG. 6B can be caused.

When the piezoelectric actuator 31 performs such an operation, the optical fiber 34 performs a bending resonant vibration in the A-direction or a bending resonant vibration in the B-direction as described in the first embodiment. These vibrations are the resonant vibrations, and hence the vibrations are noticeably large. Phases of the two vibrations are shifted as much as 90°, and an amplitude is changed little by little, whereby it is possible to obtain a spiral orbit shown in FIG. 7C.

(Effect)

In consequence, the piezoelectric actuator 31 of the present embodiment has the prismatic piezoelectric element body 32, and hence the interdigital electrodes α2, β2, γ2 and δ2 can easily be formed on the four side surfaces of the piezoelectric element body 32 by a conventional printing technology. Moreover, when the piezoelectric element body 32 is polarized by using the interdigital electrodes α2, β2, γ2 and δ2 on the four side surfaces of the piezoelectric element body, the direct-current voltage is applied between the comb teeth-like electrodes of the interdigital electrode to polarize the body, whereby it is not necessary to provide an internal surface electrode in the through hole 33 of the piezoelectric element body 32. As a result, it is possible to provide the piezoelectric actuator 31 which can simplify the whole constitution of the piezoelectric element body 32, and can facilitate manufacturing thereof in the same manner as in the first embodiment.

Fifth Embodiment (Constitution)

Figure 12A:
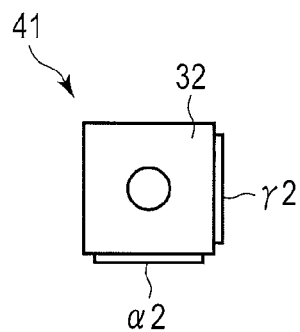
FIG. 12A is a plan view of a piezoelectric element body of a piezoelectric actuator of a fifth embodiment.
Figure 12B:
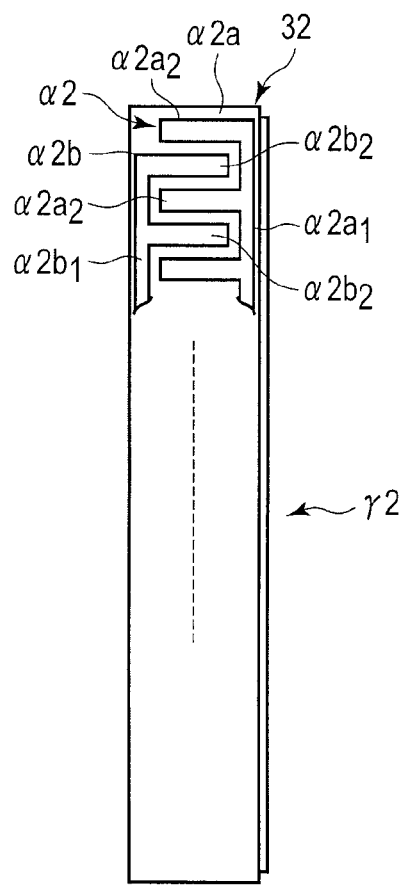
FIG. 12B is a side view of the piezoelectric element body of the piezoelectric actuator of the fifth embodiment.

FIGS. 12A and 12B show a fifth embodiment. The present embodiment is a modification in which a piezoelectric actuator 41 is provided by changing the constitution of the piezoelectric actuator 31 of the fourth embodiment (see FIGS. 10A, 10B, and 10C and FIGS. 11A, 11B, and 11C) as follows.

In the piezoelectric actuator 41 of the present embodiment, as shown in FIG. 12A, interdigital electrodes α2 and γ2 are provided only on two adjacent side surfaces of four side surfaces of a piezoelectric element body 32. In this case, a bending resonant vibration in an A-direction can be caused only by the interdigital electrode α2, and a bending resonant vibration in a B-direction can be caused only by the interdigital electrode γ2.

(Effect)

In consequence, also in the piezoelectric actuator 41 of the present embodiment, an effect similar to that of the fourth embodiment can be obtained, and additionally, the constitution can be simplified and manufacturing thereof can be facilitated more effectively than the piezoelectric actuator 31 of the fourth embodiment.

Furthermore, the present invention is not limited to the above embodiments, and needless to say, the present invention can variously be modified without departing from the gist of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A piezoelectric actuator comprising:
a prismatic piezoelectric element body having side surfaces;
external surface electrodes provided on at least three of the side surfaces of the piezoelectric element body,
the piezoelectric element body having been polarized between a pair of the external surface electrodes;
an optical fiber mounted on the piezoelectric element body; and
a power source configured to apply an alternating voltage between the two electrodes, so as to cause the optical fiber to perform a bending resonant vibration.

2. The piezoelectric actuator according to claim 1, wherein the piezoelectric element body has a through hole extending in a longitudinal direction.

3. The piezoelectric actuator according to claim 2, wherein the optical fiber is mounted in the through hole of the piezoelectric element body.

4. The piezoelectric actuator according to claim 1, wherein the optical fiber is mounted on an outer side surface of the piezoelectric element body.

5. The piezoelectric actuator according to claim 1, wherein the side surfaces of the piezoelectric element body include at least two pairs of side surfaces facing each other, and the external surface electrodes are provided on the two pairs of side surfaces, respectively.

6. A driving method of the piezoelectric actuator according to claim 1, comprising:
applying a direct-current voltage between one pair constituting two of the external surface electrodes to polarize the piezoelectric element body; and
applying an alternating voltage between another pair constituting two of the external surface electrodes to curve and vibrate the piezoelectric element body.

7. The driving method according to claim 6, wherein
the side surfaces of the piezoelectric element body include two pairs of side surfaces facing each other, and the external surface electrodes are provided on the two pairs of side surfaces, respectively,
the applying the direct-current voltage applies the direct-current voltage between adjacent external surface electrodes to polarize the piezoelectric element body, and
the applying the alternating voltage applies the alternating voltage between the external surface electrodes facing each other to curve and vibrate the piezoelectric element body.

8. A piezoelectric actuator comprising:
a prismatic piezoelectric element body having side surfaces;
an interdigital electrode provided on at least one of the side surfaces of the piezoelectric element body, and constituted of two comb teeth-like electrodes, the piezoelectric element body having been polarized between the two comb teeth-like electrodes; an optical fiber mounted on the piezoelectric element body; and
a power source configured to apply an alternating voltage between the two comb teeth-like electrodes, so as to cause the optical fiber to perform a bending resonant vibration.

9. The piezoelectric actuator according to claim 8, wherein the piezoelectric element body has a through hole extending in a longitudinal direction.

10. The piezoelectric actuator according to claim 9, wherein the optical fiber is mounted in the through hole of the piezoelectric element body.

11. The piezoelectric actuator according to claim 8, wherein the optical fiber is mounted on an outer side surface of the piezoelectric element body.

12. The piezoelectric actuator according to claim 8, comprising interdigital electrodes each of which is constituted of two comb teeth-like electrodes, the side surfaces of the piezoelectric element body including at least two pairs of side surfaces facing each other, each of the interdigital electrodes being provided on one of each pair of side surfaces.

13. The piezoelectric actuator according to claim 8, comprising interdigital electrodes each of which is constituted of two comb teeth-like electrodes, the side surfaces of the piezoelectric element body including at least two pairs of side surfaces facing each other, the interdigital electrodes being provided on the two pairs of side surfaces, respectively.

14. A driving method of the piezoelectric actuator according to claim 8, comprising:
    applying a direct-current voltage between the comb teeth-like electrodes of the interdigital electrode to polarize the piezoelectric element body; and
    applying an alternating voltage between the comb teeth-like electrodes of the interdigital electrode to curve and vibrate the piezoelectric element body.

15. The driving method according to claim 14, comprising interdigital electrodes each of which is constituted of two comb teeth-like electrodes, the side surfaces of the piezoelectric element body including two pairs of side surfaces facing each other, each of the interdigital electrodes being provided on one of each pair of side surfaces, wherein
    the applying the direct-current voltage applies the direct-current voltage between the comb teeth-like electrodes of each interdigital electrode to polarize the piezoelectric element body, and
    the applying the alternating voltage applies the alternating voltage between the comb teeth-like electrodes of each interdigital electrode to curve and vibrate the piezoelectric element body.

16. The driving method according to claim 14, comprising interdigital electrodes each of which is constituted of two comb teeth-like electrodes, the side surfaces of the piezoelectric element body including two pairs of side surfaces facing each other, the interdigital electrodes being provided on the two pairs of side surfaces, respectively, wherein
    the applying the direct-current voltage applies the direct-current voltage between the comb teeth-like electrodes of each interdigital electrode to polarize the piezoelectric element body, and
    the applying the alternating voltage applies the alternating voltage between the comb teeth-like electrodes of each interdigital electrode to curve and vibrate the piezoelectric element body.

* * * * *